United States Patent [19]

Wolcott

[11] Patent Number: 4,850,452

[45] Date of Patent: Jul. 25, 1989

[54] LOUDSPEAKER STRUCTURE

[76] Inventor: Henry O. Wolcott, 2250 N. Bigelow Ave., Simi Valley, Calif. 93065

[21] Appl. No.: 709,575

[22] Filed: Mar. 8, 1985

[51] Int. Cl.[4] .................................... H05K 5/00

[52] U.S. Cl. .................................... 181/144; 181/146; 181/150; 181/151; 181/152; 181/153; 181/155; 181/156; 181/159; 181/199; 381/156; 381/158; 381/160

[58] Field of Search .................................... 181/144–148, 181/150–156, 159, 160, 182, 185, 191, 194, 199; 381/88–90, 156, 158, 160

[56] References Cited

U.S. PATENT DOCUMENTS

| | | | |
|---|---|---|---|
| 2,065,357 | 12/1936 | Evans | 187/144 |
| 2,218,212 | 10/1940 | Nassos | 181/156 X |
| 2,224,919 | 12/1940 | Olson | 181/152 |
| 3,819,006 | 6/1974 | Westlund | 181/155 X |
| 4,176,730 | 12/1979 | Mushkin | 181/156 X |
| 4,200,120 | 4/1980 | Williams, Jr. | 181/144 X |
| 4,357,490 | 12/1982 | Dickey | 181/155 X |

FOREIGN PATENT DOCUMENTS

| | | | |
|---|---|---|---|
| 497101 | 11/1950 | Belgium | 181/145 |
| 2701080 | 7/1978 | Fed. Rep. of Germany | 181/145 |

*Primary Examiner*—Benjamin R. Fuller
*Attorney, Agent, or Firm*—William H. Maxwell

[57] ABSTRACT

One or more up-firing woofer loudspeakers (12 or 22) are mounted atop a truncated pyramidal enclosure (1 or 21). A down-firing tweeter (5 or 25) is aligned above the woofer. A sound-reflecting sphere (4 or 24) is disposed between the woofer and the tweeter. When the sphere is aligned there-between omni-directional sound is radiated in both horizontal and vertical planes. When the sphere is positioned to the rear, a medium to high frequency forward hemispherical pattern is obtained. This pattern is desirable when the loudspeaker structure is positioned against a wall. Duct ports (3) or a folded horn (20) within the enclosure enhance very low frequency sound.

16 Claims, 6 Drawing Sheets

LOUDSPEAKER STRUCTURE

TECHNICAL FIELD

This invention is referred to herein as the "Wolcott Structure" pertains to an electro-acoustical transducer structure, particularly the acoustic aspects thereof.

BACKGROUND ART

The use of both a "woofer", or bass notes only transducer, and a "tweeter", or treble notes only transducer, have constituted high-fidelity wide-range loudspeaker structures for some time. Time acoustic performance of the system, as judged at the listener's ears, determines the pragmatic results. The better this performance, the more nearly a life-like effect of "live" performers is obtained; i.e., "realism".

Sound Span Speaker Systems, of former B.I.C./AV-NET, Westbury, N,Y., employ three transducers; a woofer pointing ("firing") downward, a mid-range transducer employing a horn, and a treble transducer also employing a horn. These transducers are positioned coaxially one above the other in the order recited; the latter two transducers firing upward.

By factual analysis, an omnidirectional sound pattern is presumably obtained, but it is not seen how this pattern could be obtained vertically as well.

The sound-emitting elements being stacked coaxially vertically, an away-from-the-wall placement of the loudspeaker would be required to give the intended omni-directional lateral sound fidelity. However, if placed against a wall the backwardly-directed sound conflicts with the direct sound, and an irregular amplitude vs. frequency characteristic occurs.

Williams, Jr. in U.S. Pat. No. 4,200,170, discloses a "Pyramid Speaker Assembly", having two vertically aligned four-sided pyramids and one cone loudspeaker firing downwardly upon the lower pyramid An alternate embodiment merely doubles the structure vertically and employs two identical cone loudspeakers.

A further alternate embodiment assembles two of the initial structures, with one of them inverted, so that two cone loudspeakers are employed, one up-firing and one down-firing.

The four-sided pyramid causes a four-leaf clover horizontal dispersion of sound. The vertical pattern of the loudspeaker is not enhanced.

Typically, tweeters are not employed at all, save for a further embodiment in which a tweeter is disposed off-axis but "-in alignment with a ridge-" of pyramid. This causes a two-only (opposed) cloverleaf for the high frequencies involved.

It is seen that a uniform omnidirectional pattern for either woofer or tweeter sound is not attained.

The numerous sharp edges in the sound field are expected to give an uneven amplitude vs. frequency characteristic because of acoustic diffraction.

Westlund in U.S. Pat. No. 3,819,006, discloses a three-globe (sphere) structure, each having an identical loudspeaker within a globe, plus a spaced concave reflector that is elongated to serve the plural globes.

The acoustic structure and functioning thereof is quite the opposite of the present invention and cannot suggest the same. Standing waves occur within the globes.

Evans, in U.S. Pat. No. 2,065,367, discloses one loudspeaker adjacent to either a sphere or a second rigid cone; but this is only half of the Wolcott structure and cannot function like it. Evans experiences severe resonant distortion at audio frequencies where the average distance between the sphere and the cone of the loudspeaker is a half-wavelength of the sound.

Feller, in offenlegungsscrift 2701080, discloses two wide-frequency-range loudspeakers facing each other at adjacent apexes of truncated cones. There is no sound reflecting sphere, as in the Wolcott structure. There will be standing waves and consequent distortion in the frequency range where the average distance between the two loudspeakers is equal to a half-wavelength of the sound.

The problems in Evans and Feller are avoided in the Wolcott embodiments because the input signal frequency range is split with a crossover network between the woofer and tweeter and so proportioned that principal resonance conditions due to the spacing between the speakers and/or the sphere occur outside their primary operating frequency range.

Petroff, in Belgium Pat. No. 497,101, discloses two loudspeaker-microphone devices for communication through a wall; as from the exterior to the interior of a building. Frequency response does not appear to be involved, nor proximity effects between active audio elements.

In general, the art has been wont to combine plural loudspeakers, up to six per unit of a stero pair of loudspeakers, typically by merely firing the sound outward from the cabinet that supports the loudspeakers, but does not shape the sound pattern thereof.

Still others partially or totally enclose loudspeaker units in an enclosure that "colors" the sound by having a predominant resonant frequency. That causes the sound to have characteristic of particular musical instrument rather than a uniform amplitude vs. frequency that is suited to reproduce all musical instruments and voice with fidelity.

SUMMARY OF THE INVENTION

Typically, one or more upward-firing woofers are colinearly surmounted by a sound-reflecting sphere, which, in turn, are colinearly surmounted by a down-firing tweeter, with the sound waves thereof impinging upon the same sphere.

This configuration provides omni-directional sound both horizontally and vertically.

By moving the sphere rearwardly, a forward hemispherical pattern in the range of and above the frequency of electrical crossover between the woofer and tweeter is obtained, such as is desirable if the loudspeaker structure is to be placed against the wall of a room.

An alternate embodiment includes a downwardly extending horn within the structure housing the woofer. The horn is front-firing. It is folded.

A truncated plural-sided pyramid is employed to house the woofer. No two sides thereof are parallel. The sides are stiffened to prevent acoustic vibration.

BEST MODE FOR CARRYING OUT THE INVENTION

Figure 1:
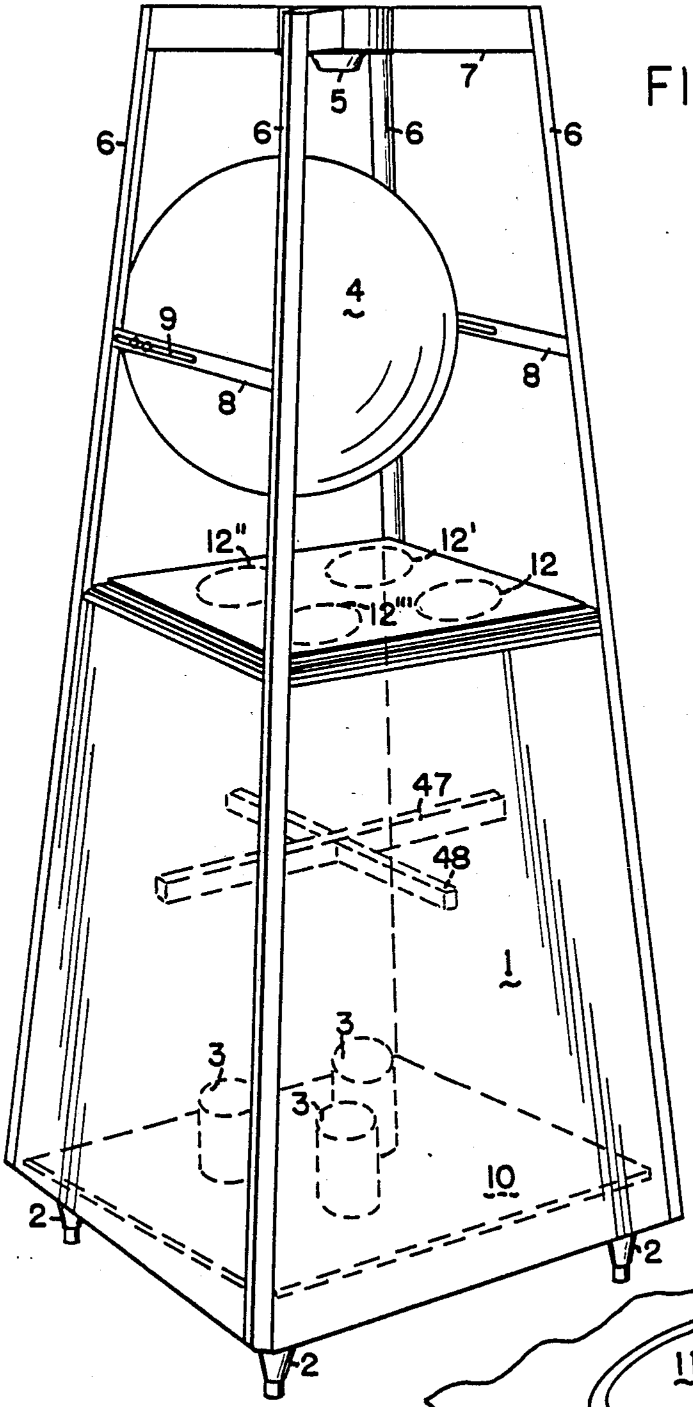
FIG. 1 is a perspective view of the loudspeaker structure showing the disposition of the principal components.
Figure 4:
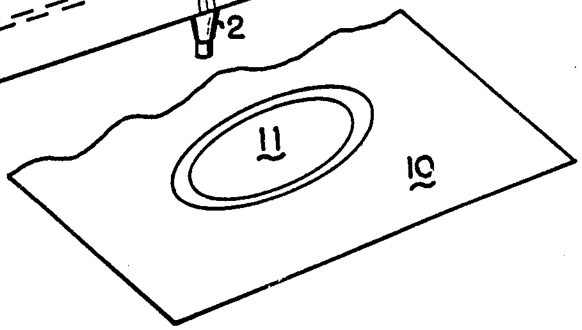
FIG. 4 is a fragmentary perspective view of the base of FIG. 1, in which an auxiliary baffle radiation (ABR) is employed.

In FIG. 1, the slant of all of the sides of truncated pyramid 1 is typically 1 in 6, i.e., for each 6 centimeters (cm) of height, the surface is inwardly inclined 1 cm.

Within normal limits of two or three to one, the structure of this invention can be embodied in different sizes. The criterion is determined by the acoustic parameters, which must be properly inter-related. This is further set forth below.

A typical size for the base pyramid is 70 cm high, with a width at the bottom of 54 cm and at the top of 40 cm. The base pyramid is supported incrementally above the floor on four feet, elements 2, each having height of approximately 6 cm. Alternately, these elements may be casters.

Hardwood braces 47 and 48 may be employed to give acoustic stiffness to the sides of the base pyramid.

The bottom of the base is closed by a rigid surface 10 that is inclined with respect to the horizontal truncated surface top, typically with a slant of 2 in 6. Acoustic ports, preferably three ducted ports 3, are provided. These are hollow cylinders extending into the interior volume of the base, typically being 9 cm in diameter by 15 cm in length.

The edges of the top of the base pyramid are rounded with the approximately 2 cm radius to prevent sharp-edge acoustic diffraction.

Physical support for sphere 4 and tweeter 5 is provided by a superstructure compressed of four vertical members 6, such as metal (or wood) angles. These extend from the bottom of base pyramid 1 to a four-arm spider 7 at the top of the structure. Part way up, two horizontal members 8 are individually fastened to an adjacent pair of vertical members 6 to support sphere 4 at the extremities of a horizontal diameter thereof. Preferably, two hollow rods that are internally threaded at each end pass through holes in the sphere and receive screws that slide in slot 9 in the horizontal member for the support of the sphere. This allows a forward and back adjustment of the position of the sphere.

Members 6 each have a quarter-round wood insert to provide a rounded inner surface for preventing acoustic diffraction. Of course, rounded metal tubes may be substituted for angle members 6 to prevent acoustic diffraction.

The embodiment of FIG. 1 has four woofers, 12, 12′, 12‴, 12″, symmetrically disposed in the flat upper surface of the truncated base pyramid structure 1. These are electrically connected in parallel and are the equivalent of one larger woofer. Each of the four may have a diameter of approximately 15 cm, and be the long-throw type TP165F, of which Peerless Audio Manufacturing Corp. is a manufacturer. The acoustic range is from approximately 30 hertz to 5,000 hertz.

Tweeter 5 has a 3 cm dome radiator and an external diameter of approxiamately 11 cm with a vertical cylindrical length of 3 cm. The central circular portion of spider 7 is also approximately 11 cm so that edge acoustic diffraction is minimal. The four arms of the spider are each approximately 3 cm high by 1.5 cm thick. The invention effort is to minimize any structure around the tweeter, so that it approaches the effect of being suspended in vacant space. The tweeter range is from 1 kilohertz to 20 kilohertz, and may be the soft dome type of Dynaudio of Denmark, type DL8AF.

The relative placements of the woofer, sphere and tweeter are determined by acoustic considerations. The structure of this invention allows a large advance in acoustic fidelity by maintaining coherency in amplitude and phase of the sound over the whole range of sound reproduced, and in all directions from the loudspeaker. It will be realized that when a given sound involves audio frequencies that are emitted by both the woofer and the tweeter, these frequencies must reach the ear of the listener at the same instant of time; otherwise a smearing of the sound image occurs. The inertia of the larger moving system of the woofer is greater than that of the smaller moving system of the tweeter. Accordingly, when a step function waveform, such as from tap dancing, is impressed upon both loudspeakers, the sound is emitted first from the tweeter and second, from the woofer. Although the interval between the two sounds may be only a fraction of millisecond, the effect is discernible. The effect can be eliminated by spacing the tweeter farther from the sphere than the woofer, in the present novel structure.

The difference in the spacing is determined by the dynamic characteristics of the two speakers involved. It is constant for those speakers. Thus, the vertical position of the sphere can be fixed for a given pair of speakers. For the speakers previously identified, the vertical position is 29 cm from the diaphragm of the tweeter to the center of the sphere and 25 cm from the woofers to the center of the sphere. Considering the reflection areas on the sphere for the tweeter and the woofer, this amounts to 2.58 cm difference in path length. If this was not taken into consideration, at the crossover frequency of 2000 hertz, a phase difference of 54° would exist. This is undesirable for impulse sounds.

Loudspeakers are almost invariably operated in a room, such as the living room of a family residence. Under such conditions the sound heard by a listener is that directly from the loudspeaker, and that reflected from the walls, ceiling and floor of the room. Although it may not be generally known, acoustic testing carried on by the inventor prior to the invention of the present loudspeaker structure revealed that although the direct on axis sound from the usual loudspeaker might have a smooth amplitude response characteristic as a function of frequency, that characteristic from the sides of the loudspeaker had numerous "hills and valleys" and was the very opposite to a smooth response. The same was true for the characteristic from the rear of the loudspeaker, usually with a different set of hills and valleys.

In a room, all of these sounds reach the listener, giving a jumbled response that belies realism and naturalness of the sound. Such a response may be accepted by a listener, as what has always been heard from a loudspeaker. However, once the clarity and realism of a superior response has been heard the advance in technique is readily appreciated.

Superior response is obtained with the present loudspeaker by virtue of the reflection of sound from both tweeter and woofer from a single sphere. Two directional patterns are available, depending upon the placement of the sphere with respect to the loudspeakers.

For placement of the loudspeaker structure away from a wall in a room, such as might occur in a large room, a uniform spherical pattern in both horizontal and vertical planes is desired and is secured by locating the sphere coaxially with respect to both the tweeter and the woofer. In most high-fidelity sound reproduction, a stereophonic ("stereo") signal sound source is provided and two of the present loudspeaker structures are used, spaced one from the other by a few meters.

When the loudspeaker structure(s) are to be placed against the wall of a room, it is desirable to limit the horizontal sound directional pattern to a hemisphere; i.e., to the free space in front of the wall.

This is accomplished by moving sphere 4 rearwardly a distance of 5.4 cm in the present embodiment. In this position, the vertical axis of the tweeter impinges upon the surface of the sphere at an angle of 45°. Because the remainder of the sphere above the 45° point is an obstruction, the sound from the tweeter cannot radiate backward toward the wall.

The upper audio frequencies in the woofer range, such as at the crossover frequencies, typically from 1,000 to 3,000 hertz, are given some directivity by the position of the sphere, similar to the tweeter frequencies. However, low audio frequencies, such as 100 hertz and below, are non-directional, but this does not effect the performance of the loudspeaker structure of this invention.

Certain modifications of the structure of this loudspeaker may not be made and still retain its performance.

The position of the woofer and tweeter may not be interchanged. When up-firing, the sound from the tweeter reaches the ceiling of the room and destroys the otherwise "point source" of the loudspeaker structure as previously described. Also, the base truncated pyramid must then be inconveniently above the sphere, and floor loading of the base frequency ports is absent.

Another undesirable modification is to position the ducted ports 3 on a side of the truncated enclosure 1, rather than at the bottom. Measurements show that a loss of low frequency response occurs, amounting to over 30% of the lower limit response over that obtained with the ports in the bottom of the truncated enclosure. The greater phase lag of the low frequencies out of the bottom ports because of the greater distance from the woofer is believed responsible for the improvement.

Substitution of an auxiliary baffle radiator (ABR) may be made in the bottom of the truncated enclosure with results approaching those obtained with the ducted ports 3. The ABR is a flat resiliency mounted stiff diaphram, in this instance about 30 cm in diameter, 11. The sphere is typically hollow and of glass, or an equivalent very hard substance, such as ceramic or a glass-like plastic. Soft wood and similar soft substances are not satisfactory. With translucent glass or equivalent, an optional light-emitting element, such as light bulb 30, can be contained within the sphere and the same thereby illumunated. Music-controlled lamps may also be utilized.

While the true sphere is a preferred shape, this may be modified to an elongated "sphere", having the major axis vertical. This accomplishes functioning according to this invention by reason of providing increased extreme side projection when in the recessed position with the loudspeaker structure against a wall due, to the acoustic geometry involved.

Figure 5:
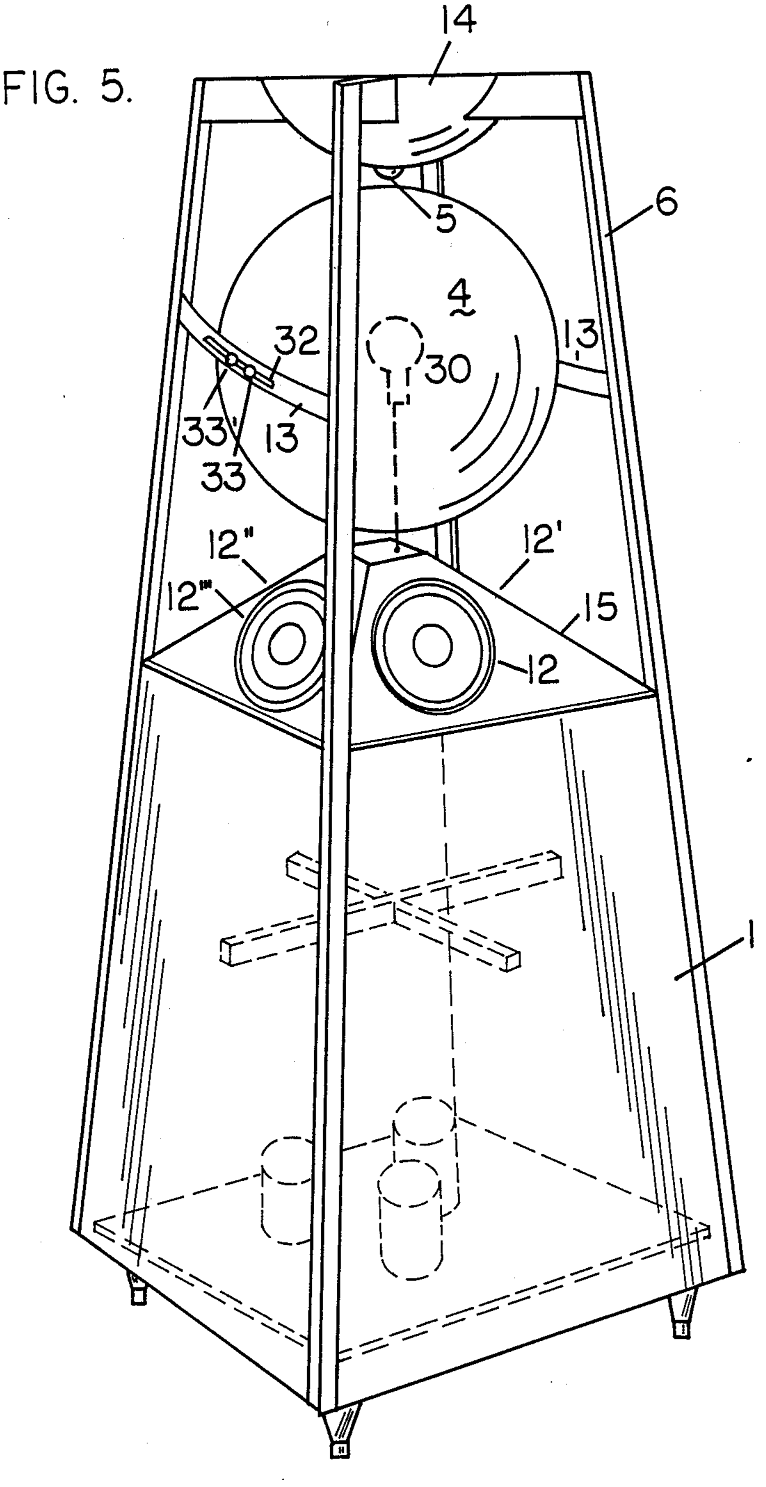
FIG. 5 is an alternate embodiment of FIG. 1 differing in the mounting of the woofers and the upper structure configuration.

FIG. 5 is the same as FIG. 1 in so far as the design of the base pyramid is concerned except for woofer mounting which is on a flat baffle in FIg. 1 and on a truncated pyramid shape 15 of approximately 45 degrees in FIG. 5. Also, the tweeter mounting is in a partial hemisphere in FIg. 5, instead of on the spider support of FIG. 1.

As to the woofers, the effort is to minimize the response irregularities of the system in the critical midfrequency range that are due to phase cancellation effects at listening positions where the acoustic centers of the woofers are multiples of ½ wavelength apart.

The effective acoustic center spacing is reduced with pyramid mounting by 50–100% depending on the position of the listener, extending the upper frequency limit of uniform woofer response by a corresponding amount. This allows use of a higher crossover frequency, and simplifies the selection of the tweeter by reducing its low frequency response requirements.

Another benefit is that the depth of the phase cancellation nulls remaining in the region of attenuated woofer response above crossover are greatly reduced due to the 90 degree angle of lateral dispersion between speakers.

The functioning of the reflecting sphere 4 relative to woofer response in the embodiment of FIG. 1 is to disperse the higher frequency components of woofer sound output lateraly and vertically beginning at approximately 500 Hz and with full effectivity above 1500 Hz.

In FIG. 5, the effect of sphere 4 on the woofers is somewhat less than in FIG. 1 due to the fact that these are direct radiating both laterally and vertically due to being angled upward at 45 degrees in four quadrants. The principle effect of the sphere is to improve the maximum angle of downward vertical propagation, to isolate the effect of the oppositely facing woofers on one another and to isolate the effect of the woofers on the tweeter.

The tweeter 5 in FIG. 5 is mounted in a partial hemisphere 14 of typically 15.25 cm radius with four radial supporting arms rather than in the flat circular portion of spider 7 of FIG. 1.

Sphere spacing between woofer and tweeter is closer in FIG. 5 than in FIG. 1. The sphere 4 in FIG. 5 of approximately 15.25 cm is positioned approximately 1.5 mm below the tweeter dome and approximately 1 cm above the top of the truncated pyramid speaker baffle.

The sphere of FIG. 5 is mounted on curved horizontal supports 13 instead of the straight supports 8 of FIG. 1 to allow the tweeter to sphere spacing to remain constant when the sphere position changed.

The result of mounting the tweeter in a hemisphere with close spacing to the reflecting sphere is an improvement in overall efficiency of 4 of 5 db, flatter frequency response, reduced distortion and elimination of standing waves in the audio range between the tweeter and sphere as well as differences in arrival time between direct sound from the tweeter dome and reflected sound from the sphere.

The structure formed by utilizing a lower closely spaced sphere and upper partial hemisphere with a centered sound source (tweeter) results in a new form of radial projector which efficiently propagates coherent sound waves over a 360 degree horizontal axis and an approximately 120 degree vertical axis. For greater power handling, opposing tweeters can be mounted in adjacent surfaces of the sphere and partial hemisphere. It should be understood that the partial hemisphere is used for convenience and appearance and can instead be a complete sphere.

Figure 2:
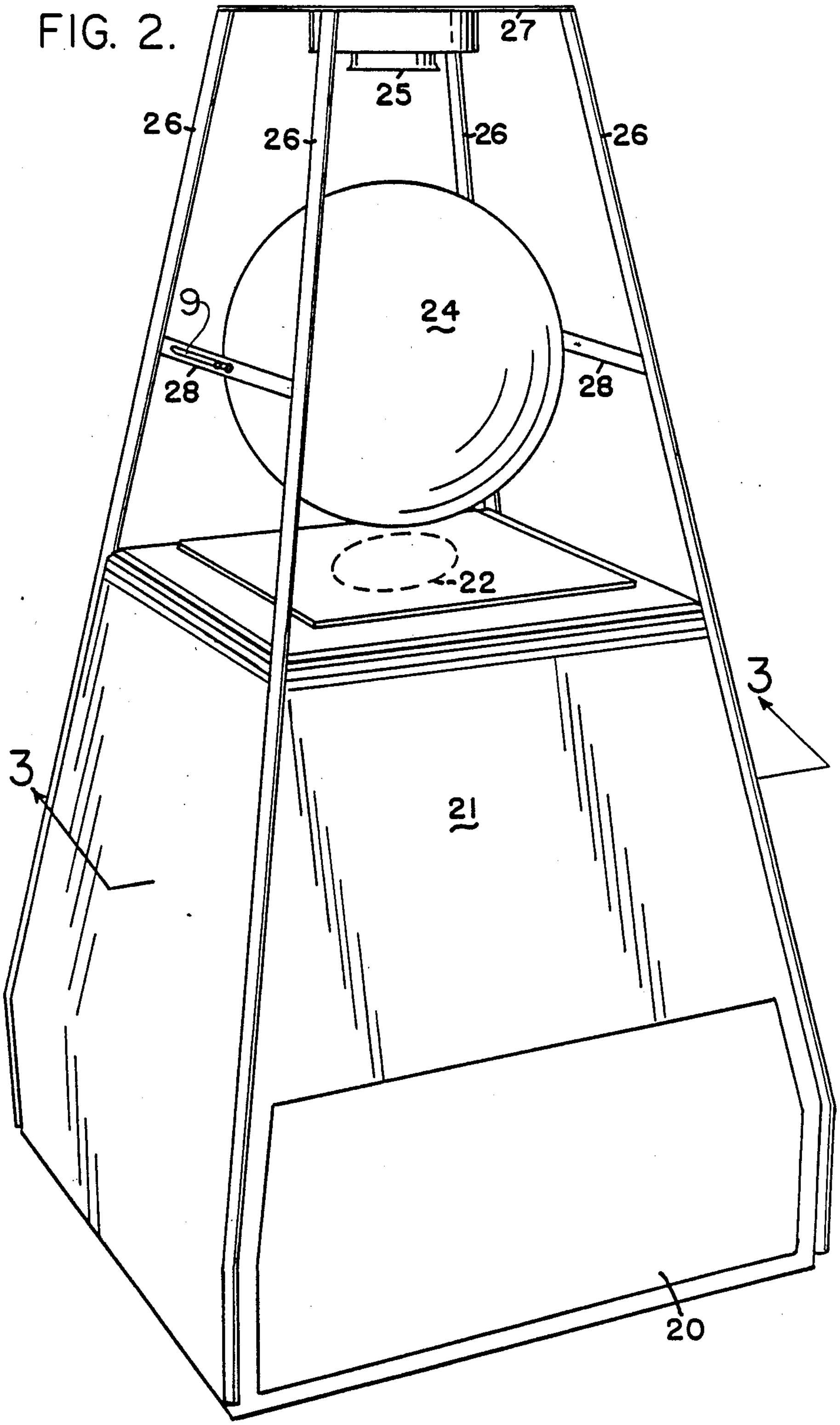
FIG. 2 is a perspective view of an alternate embodiment of the loudspeaker structure in which a base horn is utilized.

An example of another preferred embodiment of the subject invention is shown in FIG. 2.

A distinguishing feature is an internal folded horn in the base truncated pyramid 21, having a forward-opening mouth or exit aperture 20.

A single large woofer 22, such as the type LR1280C of Professional Audio Systems, a California corporation, is disposed in the top horizontal surface of the truncated pyramid base. The downward emission of sound therefrom passes through horn 20, while the upward emission of sound passes to sphere 24, which typically is the same as prior sphere 4.

Four fully-cylindrical external tubing members 26 extend from the bottom of pyramid 21 to above the same for supporting sphere 24 and tweeter 25. The latter is supported by metal spider 27.

The woofer-sphere-tweeter relationship is as before. To illustrate the two time positions that the sphere can occupy, forward and back; sphere 4 is shown in the back position, while sphere 24 is shown in the forward, or vertically coaxial position.

The top edges of truncated pyramid 21 are rounded with a 3 cm radius to prevent sound diffraction, as has been previously explained.

Typical dimensions for the embodiment of FIG. 2 are; for the truncated pyramid, 77 cm high, 69 cm on a side at the bottom, and 43 cm on a side at the top. The sphere, of typically 36 cm diameter, is supported at a height of 4 cm above the top surface of the truncated pyramid and the tweeter is mounted 12 cm above the top of the sphere.

As before, spider arms 27 are of minimal cross-section and the diameter of that structure around the tweeter is not greater than that of the tweeter itself.

The opening or exit aperture 20 extends totally across the bottom of truncated pyramid 21 and is 30 cm high by 65 cm wide in the embodiment of FIG. 2.

Figure 3:
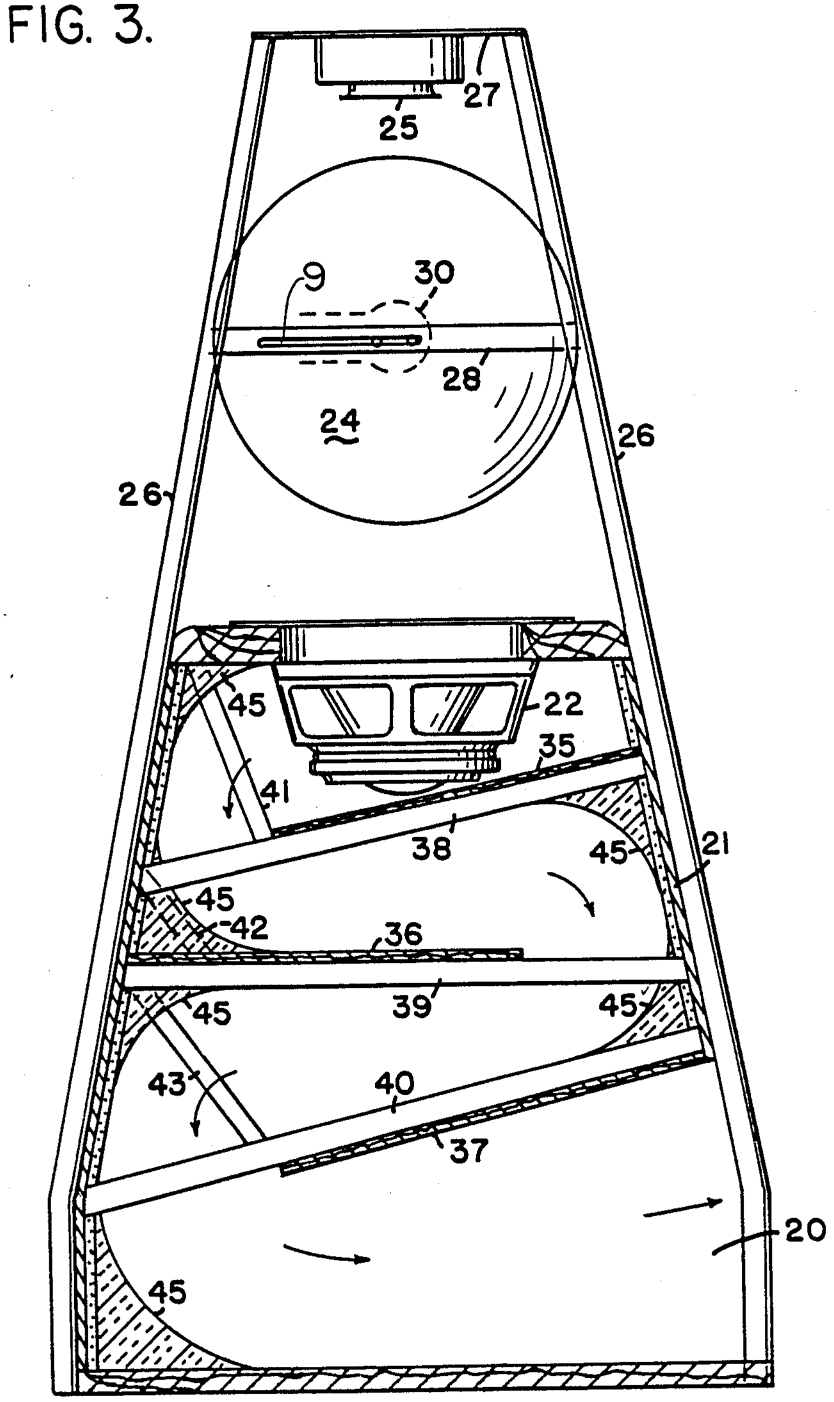
FIG. 3 is a vertical sectional view of the structure of FIG. 2 along lines 3—3, showing the construction of the folded base horn, in section.

A horn is formed of baffles within the truncated pyramid, as shown in FIG. 3. When thus formed, the length of the horn is approximately 215 cm.

First baffle 35 is disposed at a downward slant of approximately 12° to the horizontal closely below the frame of woofer 22. The baffle extends 75% of the distance from the front surface of the truncated pyramid base.

Second baffle 36 is disposed horizontally and extends 70% of the distance from the rear surface of the base.

Third baffle 37 is disposed at a downward slant of approximately 15° to horizontal and extends 65% of the distance from the front surface of the base.

These baffles extend completely from side to side of the base and are securely fastened thereto by glue or equivalent means.

Additionally, stiffeners 41, 42, 43 extend from the rear corners at an approximate angle of 30° from the vertical and are fastened to horizontal stiffeners 38, 39, 40, respectively. The latter are centrally located, side to side, and are individually rigidly attached to baffles 35, 36, 37, respectively.

The baffle and stiffener structure is typically fabricated of dense particleboard 1.2 cm thick, while the truncated pyramid base is 2 cm thick. An inner lining of the truncated pyramid base of "soundboard"; i.e., a fiber board that is loosely packed, is desirable.

Also it is desirable but not mandatory, to install five formed curved elements 45 of a sound-reflecting material, such as fiberglass, in the several sharp corners existing between the baffles and the front and rear of the truncated pyramid base. These provide a desirably relatively smooth inner surface for the horn chamber.

Figure 6:
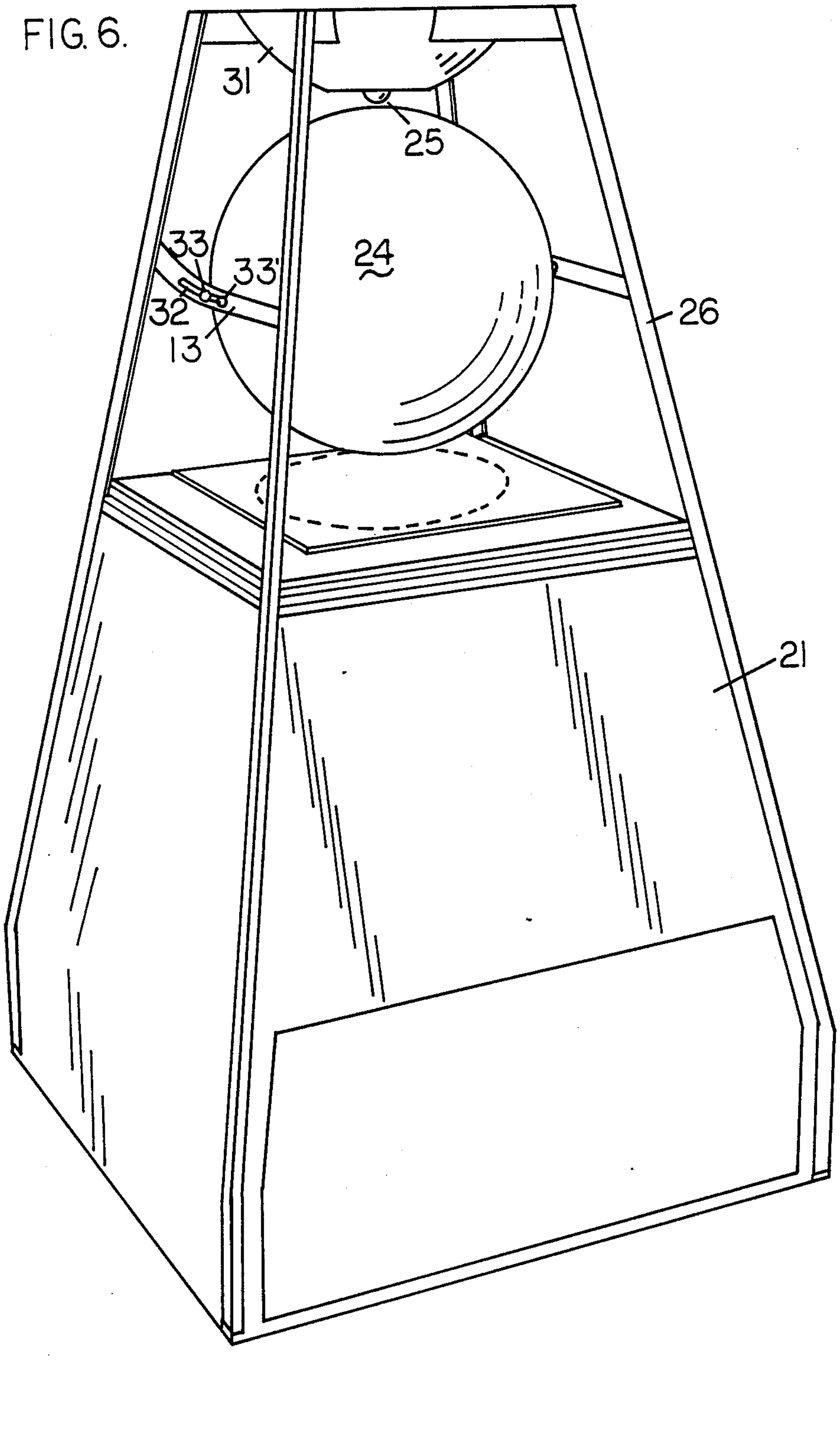
FIG. 6 is an alternate embodiment of FIG. 2 differing from it in the upper structure configuration.

FIG. 6 is the same as FIG. 2 in so far as the base pyramid is concerned. The tweeter mounting of FIG. 6 however, differs from that of FIG. 2 in that the tweeter is mounted on a partial hemisphere 31 instead of on the flat circular portion of spider 27 of FIG. 2.

The spacing between the sphere and the tweeter is also closer in FIG. 6 than in FIG. 2. The sphere of approximately 35.6 cm diameter, is positioned approximately 12 cm below the tweeter in FIG. 2 but only approximately 1.5 mm below it in FIG. 6.

The sphere of FIG. 6 is mounted between curved horizontal supports 13 instead of the straight supports 28 of FIG. 2 to maintain a constant spacing between the tweeter and the globe with different front to back positions. The advantage obtained due to the changes described between FIG. 2 and 6 are substantially the same as those mentioned in the description of FIG. 5 relative to FIG. 1.

Figure 7:
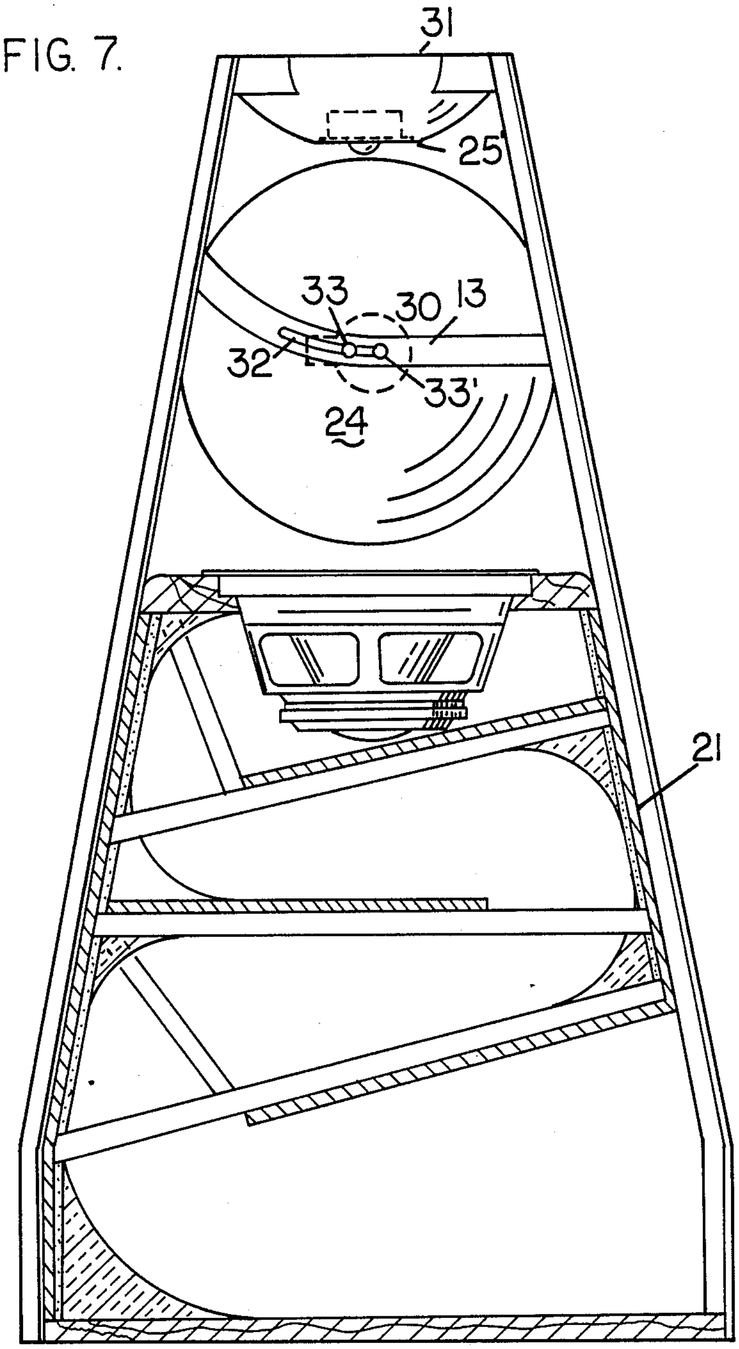
FIG. 7 is the same alternate embodiment of FIG. 2 shown in vertical section.

FIG. 7 is a sectional view of FIG. 6 to indicate the internal baffle structure.

The truncated pyramids illustrated herein have square bases. These are typical, but not essential, to the acoustic functioning of the invention. By geometrical definition, a pyramid may have a triangular, square or polygonal base, and these variants may be herein employed.

An electro-acoustical transducer structure is, of course, a definitive term for a loudspeaker structure. The input is electrical, the output is acoustical, and the transducer is the device that accomplishes the transformation of energy from one form to the other.

I claim:

1. An electro acoustical transducer structure, comprising;

(a) a base enclosure of approximately truncated pyramidal shape, having sides, a top and a bottom, (b) at least one woofer disposed upon the said top and oriented to emit sound upward, (c) a sound-reflecting sphere supported by a superstructure mounted upon said base enclosure above said woofer, and (d) a tweeter mounted upon said superstructure above said sphere, said tweeter being oriented to emit sound downward, the woofer, sphere, and tweeter thus positioned being acoustically related to cause essentially omnidirectional sound to be radiated from said electro-acoustical transducer structure.

2. The structure of claim 1 in which;

(a) said sphere having a diameter disposed rearwardly an amount up to approximately 30% thereof with respect to a substantially axial alignment with said tweeter to alter the acoustic relation between the woofer, tweeter and sphere giving a forward hemispherical radiation of higher frequency sound from the electro-acoustical transducer structure.

3. The transducer structure of claim 1, which additionally includes;

(a) a folded horn within said base enclosure, formed of plural baffles within said base enclosure and having a front exit aperature.

4. The transducer structure of claim 3, in which;

(a) said folded horn is formed of plural baffles, each disposed against alternate opposite sides of said base enclosure and extending approximately 70% from the alternate sides of said enclosure, and (b) each of said baffles including a centrally located stiffener that extends fully between the alernate sides of said base enclosure.

5. The transducer structure of claim 4, which additionally includes;

(a) curved elements fitted into each corner formed by a said baffle and a side of said base enclosure against which said baffle is disposed, to form a curved interior path for said folded horn at each said corner.

6. The transducer structure of claim 1, which additionally includes;

(a) means to incrementally elevate the bottom of said base enclosure above a floor, and (b) at least one ducted acoustic port disposed in the bottom of said base enclosure.

7. The transducer structure of claim 6, in which;

(a) said bottom is inclined at an angle to the top supporting said at least one woofer.

8. The transducer structure of claim 6, in which;

(a) there are three ducted acoustic ports.

9. The transducere structure of claim 1, in which;

(a) said base enclosure of approximately truncated pyramidal shape has more than two sides.

10. The transducer structure of claim 1, which additionally includes;

(a) said superstructure comprised of plural vertical members each having a rounded surface facing the said sphere, (b) first means to fasten said vertical members to said base structure, (c) second slat means with slots engaging pins in said sphere to fasten said sphere to said vertical members and to permit back and forth movement of said sphere, and (d) third means to fasten said tweeter to said vertical members.

11. The transducer structure of claim 1, which additionally includes;

(a) said sphere being of light-permeable material, and (b) a light-emitting element disposed within said sphere to illuminate the external surface thereof.

12. The transducer structure of claim 1, which additionally includes;

(a) an auxiliary baffle radiator disposed in the bottom of said base enclose.

13. The transducer structure of claim 10, in which;

(a) transducer structure includes plural opposed curved slats, each having curved slots, and (b) said sphere having plural projecting pins engaging said curved slots to position the sphere and to retain a constant spacing between said sphere and said tweeter.

14. The transducer structure of claim 13, in which;

(a) said curved slots curve about a center of said tweeter to an outer extremity thereof.

15. The transducer structure of claim 1, in which;

(a) said top has a pyrmaidal shape having adjoining faces with a woofer mounted on each face and oriented to emit sound at an angle within a range of 30–60 degrees from a horizontal plane.

16. The transducer structure of claim 1, in which;

(a) said tweeter, oriented to emit sound downwardly, is mounted on a partial hemishpere positioned oppositely above said sphere in close proximity thereto, to form a circular projector of sound of wide flare rate between the sphere and the partial hemisphere, as a function of distance from a center of said tweeter.

* * * * *